United States Patent [19]

Clark et al.

[11] 4,115,683
[45] Sep. 19, 1978

[54] LASER PIERCING OF MATERIALS BY INDUCED SHOCK WAVES

[75] Inventors: Kendall Clark; Milton R. Shapiro, both of Poughkeepsie, N.Y.

[73] Assignee: International Business Machines Corporation, Armonk, N.Y.

[21] Appl. No.: 785,270

[22] Filed: Apr. 6, 1977

Related U.S. Application Data

[62] Division of Ser. No. 533,362, Dec. 16, 1974, abandoned.

[51] Int. Cl.² .............................................. B23K 9/00
[52] U.S. Cl. ................................................ 219/121 L
[58] Field of Search ...................... 219/121 L, 121 LM

[56] References Cited

U.S. PATENT DOCUMENTS

| | | | |
|---|---|---|---|
| 3,226,527 | 12/1965 | Harding | 219/121 L |
| 3,371,404 | 3/1968 | Lemelson | 219/121 L UX |

*Primary Examiner*—J. V. Truhe
*Assistant Examiner*—Fred E. Bell
*Attorney, Agent, or Firm*—Henry Powers

[57] ABSTRACT

Apparatus and processes are utilized to pierce holes in a brittle material by the use of laser induced shock waves. The waves are generated in an environment of compressed gas which confines the shock wave and carries the debris away. The material is moved into and/or through the work area in the $y$-direction either by a supporting web with associated rollers or sliding action. The laser beam scans in the $x$-direction and computer control is utilized to either deflect a continuous beam or switch a pulsed beam "on" where a hole is desired in the material.

9 Claims, 13 Drawing Figures

LASER PIERCING OF MATERIALS BY INDUCED SHOCK WAVES

This is a division of application ser. No. 533,362 filed Dec. 16, 1974 now abandoned.

BACKGROUND OF THE INVENTION

1. Field of the Invention

This invention relates to apparatus and a method of utilizing lasers to create shock waves in gaseous environments by ionization techniques and then using the generated power of the shock waves to pierce or cut one or more holes into a brittle material such as an electronic circuit board.

2. Description of the Prior Art

The application of lasers for cutting techniques is generally well known, and the literature is replete with numerous devices and methods. The unique beam shaping capabilities coupled with the ability to generate high power pulses have made lasers the subject of intense scrutiny for purposes as diverse as delicate eye surgery and weapons of destruction. The vast number of these investigations employ localized heating to burn away material and thereby make the necessary cut and are typified by patents such as Fry, U.S. Pat. No. 3,629,564. This heating, while advantageous in some situations, can be a detriment and in any case involves high powered lasers.

Another problem is the removal of residue resulting from the cutting operation. The use of air to sweep away the debris is shown in Houdicroft, U.S. Pat. No. 3,612,814. This patent teaches cutting a work piece with a laser beam 26 and then using a pressure differential to sweep away the debris caused by the cutting action (see Col. 2, lines 15-33). In the example described in connection with FIG. 1, the work piece is assumed to be a material such as paper, cloth or the like which is easily cut by the laser. The beam cuts cloth 32 and the low pressure in chamber 36 causes air to rush through the cut and carry away the debris. A pumping chamber 36 is used to create the low pressure.

Similarly, Konig, U.S. Pat. No. 3,649,806, teaches a method for forming perforations in a work piece and combines an energy beam, such as an electron beam or laser (see Col. 4, lines 15 et seq), and gaseous pressure for blowing out the material in the perforation. This patent is directed only to using the beam to heat the work piece to a liquid or vapor at the point to be perforated. The gaseous pressure is provided by an auxiliary substance which is typically embedded in the backing of the work piece. After initial perforation, the beam strikes the auxiliary substance and vaporizes it. The high pressure resulting from the vaporization blows the molten particles of the work piece away.

An example of the use of high power lasers is found in Saunders, U.S. Pat. No. 3,742,182 where a mask of stainless steel or other such material is placed over the sheet to be perforated and the laser is scanned, burning holes along the path in conformance with a hole pattern in the mask. A jet of air is utilized to sweep away the debris. The size of the beam is purposely focused to a larger diameter than the hole to be drilled to insure that complete burning takes place. Such applications of lasers, there a $CO_2$ laser at 10.6 microns, indicate the object of relying on burning or vaporization of the material itself as opposed to the generation of shock waves as in the present invention which does the work on the material.

SUMMARY OF THE INVENTION

The disadvantages inherent in the prior art, e.g., the requirement of high power beams which cut by "brute force" through localized heating, or the generally slow and cumbersome mechanical punching techniques, have created a need for a more efficient, yet reliable system for punching large numbers of holes in a work piece.

Within the electronics industry a commonly used material for circuit boards is a sheet of unfired ceramic comprising powered alumina, glass and a plastic binder. The unfired and/or uncured ceramic layer is known as a "green sheet". These sheets, although the material itself is brittle, are relatively flexible because the material is thin, the ceramic is unfired, and the sheet includes a plastic binder. Additionally, the sheets are perforated in various patterns to provide a means for permitting electrical conduction between points above and below the sheet and these perforations are known as "via-holes". Commonly, printed circuits are made by a layering of these green sheets which may then be fired in a furnace to become an integral ceramic. This invention is concerned with the techniques and apparatus for making green sheets having the desired pattern of via-holes.

The invention permits one to utilize the speed and accuracy of computer plotting techniques to position a laser over the work piece in the location where a via hole is required. A raster scan is used to generate a sequencing of the laser vis-a-vis the moving work piece. The beam itself, requiring orders of magnitude less power than employed in the prior art, ionizes compressed gas over the work piece and as a consequence a shock wave having a high pressure wave front is produced. This shock wave, confined by the compressed gas, forces a hole through the green sheet, and with the debris is forced away by the action of the gas and a vacuum system. Little or no heating of the work piece occurs during the perforation operation.

Accordingly, it is an object of this invention to provide a method of making perforations in a sheet by the action of laser generated shock waves.

It is a specific object of this invention to provide apparatus for the continuous processing of work pieces for making a pattern of perforations by shock wave induced fracturing and/or piercing.

It is a further object of this invention to provide a system using laser beams focused above a material, in a pressurized environment, to ionize a gas thereby creating shock waves which fracture and/or pierce the material.

Yet another object of the present invention is to provide a method and apparatus for making via-holes in green sheet material.

Numerous other objects and advantages of the invention will be apparent as it is better understood from the following description, which taken in connection with the accompanying drawings, disclosed the preferred embodiments thereof.

DETAILED DESCRIPTION OF THE PREFERRED EMBODIMENT

Figure 1:
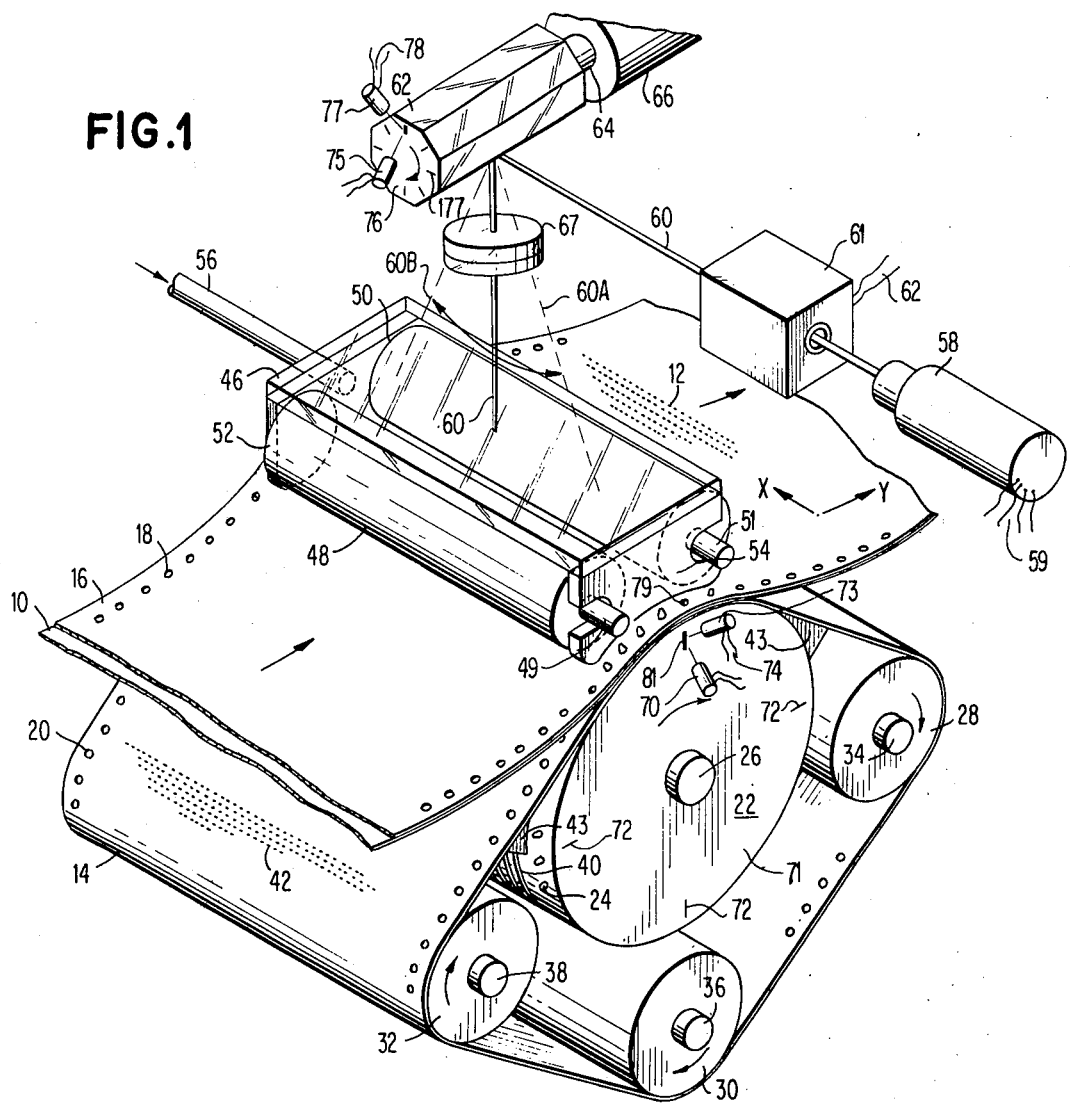
FIG. 1 is a functional operational diagram of the apparatus of the first preferred embodiment of the invention.
Figure 2:
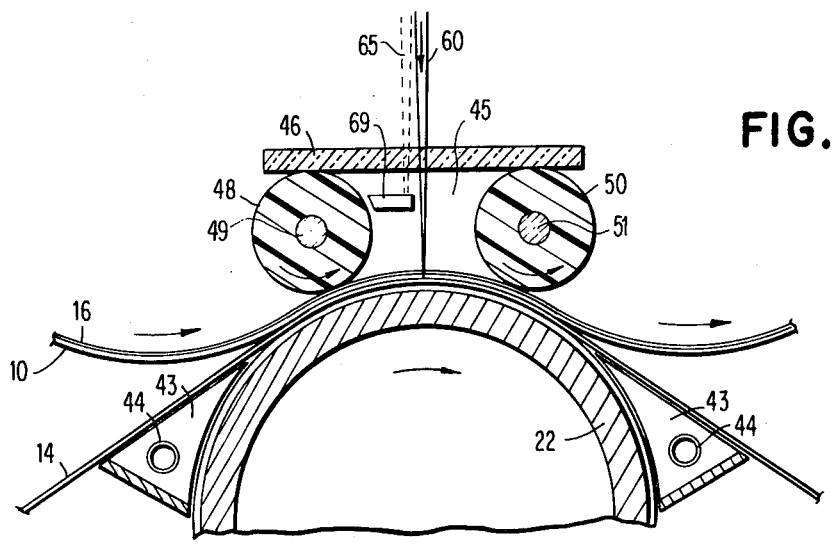
FIG. 2 is a schematic end view of the work area of the device of FIG. 1.
Figure 3:
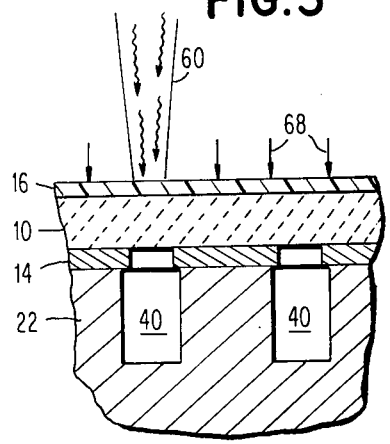
FIGS. 3–8 illustrate schematically the sequencing of the shock wave action through the work piece in accordance with the operation of the FIG. 1 embodiment.

Referring now to the drawings and in particular FIGS. 1 and 2, the green sheet 10 into which via holes 12 are to be made rests on a perforated stainless steel support web 14. A backing sheet 16 may be laminated to the green sheet and is typically 0.5–1 mil thick Mylar, polystyrene or any number of other commercially available similar thermoset or thermoplastic materials. The backing sheet adds strength to the green sheet and, as will be more fully developed, in one preferred embodiment enhances the shock wave which creates the hole in the green sheet. The green sheet, backing material and supporting web are provided with a series of sprocket holes 18, 20 for proper registration with the grooved drive cylinder 22 which has a corresponding series of sprockets 24. The cylinder is driven clockwise by shaft 26 in a manner to the described at the desired rotational speed. Three idlers 28, 30, 32 are provided to properly tension the support web 14 and are positioned by corresponding shafts 34, 36 and 38. The drive cylinder has a series of concentric grooves 40 which define parallel paths in the y-axis for the location of via-holes and are the channels for the removal of debris or residue during the via-hole formation process. The web 14 has a matrix of perforations 42 which are coincident with all possible via-hole positions on the green sheet. Characteristically, patterns with up to 30,000 perforations at various grid matrix points may be made in a 6 inch by 6 inch area with each perforation about 0.006 inch in diameter and as close as about 0.012 inch centerto-center.

Positioned between the web 14 and the drive cylinder 22 in close proximity to the work area are two supports 43, coated with teflon which define a closed area adjacent the work area into which residue from the formation process is deposited. This material is swept away in a conventional manner by a vacuum, not shown, in tubular couplings 44.

The work area is defined by a pressurized chamber 45 comprising a top window 46, two compliant polyurethane rollers, 48, 50 on shafts 49, 51, end walls 52, 54 and the backing material 16. Sealing by sliding and rolling contact of the rollers 48 and 50 with the top window 46, the end walls 52, 54, and the backing material 16 facilitates the pressurizing of the area defined by these boundaries, which as shown in FIG. 1 extends laterally across the green sheet. The end walls 52, 54 may be machined from a low friction material, such as teflon, with formed arcs providing a sliding pressure seal against the backing sheet 16 over the top arc of the cylinder 22 between the rollers 48, 50. An input source 56, of gas, is used to pressurize the chamber with a gas that is preferably non-oxidizing such as nitrogen or argon. Typically, chamber pressures are preferably upwards of 100 lbs/in$^2$ and the pressure is sensed and maintained using standard techniques.

The formation of via-holes utilizes a laser source 58, with the beam 60 deflected by a rotating multi-facet mirror 62. The mirror is rotated by shaft 64 from motor 66 to sweep the beam across the green sheet in a manner to be more fully developed herein. The laser, preferably operating in the visible spectrum can be operated in either of two modes. A pulsing mode can be carried out by Q switching of the laser itself. For example, a yttrium aluminum garnet laser, commonly known as YAG laser, can be employed and Q switched on and off at frequencies above 1 MHz. In the CW (continuous wave) mode the beam path of the laser, e.g., a YAG or other suitable laser, is deflected. As illustrated in FIG. 2, the path of the beam 60 is deflected to 65 by a standard electro-optical device 61, shown in FIG. 1. A blocking means between the end walls 52, 54, such as a mass of tungsten 69 intercepts the deflected beam 65. The functional plane of the blocking means 69, shown in FIG. 2, is spaced above the normal depth of focus which is near the backing sheet. The tungsten mass thus absorbs and dissipates the unfocused laser energy from the deflected beam 65 without being damaged. In either case, the beam 60 is focused by a lens 67 to a spot that may be as small as 0.001 inch diameter. As shown in FIG. 2, the focus is not planar but has a waist-shaped depth of field. This depth of field may include not only the top surface of the backing material but may extend a short distance above it.

The operation of the preferred embodiment shown in FIGS. 1 and 2 is as follows. The green sheet 10 moves, via the support web 14, into and through the work area while the optical axis 60 of the laser is swept through an angle 60A, 60, 60B across the green sheet in a plane perpendicular to the motion of the continuous web by means of the multi-facet rotating mirror 62. The lens 67 focuses the laser beam 60 to progressive points in a line on and above the backing sheet 16 as the beam is swept through the angle 60A, 60 60B. The combination of motions, the laser beam in the x-direction and the web in the y-direction, results in a raster scan pattern by the optical axis over the green sheet. It should be noted the laser itself is not physically moved but by the beam deflection techniques alignment is maintained and the speed of the operation is enhanced. A computer, not shown, associated with the via-hole piercing system is provided with and maintains coordinate data for both the sheet under the laser and also the required hole pattern. As the laser scanning progresses across the moving work sheet, the computer will either activate the normally "off" laser to an "on" condition or, in the continuous mode, shift the focal point to the position where a hole is desired.

To provide the computer with y-coordinate data for the sheet, an illumination source 70 directs a narrow beam of light towad a mirror surfaced encoding disk 71 that is attached to the end of the rotating cylinder 22. The encoding disk has multiple-reflecting encoding marks 72 (only four marks shown). The marks align with each transverse row of perforation holes 42 in the web 14 as the web passes under the scanning laser beam 60A, 60, 60B. Precision alignment between the encoding marks 72 and the rows of perforation holes 42 is provided by the cylinder 22 with sprocket teeth 24, and the sprocket holes 18 in the web 14, while the sprocket holes 18 through the backing sheet 16 and the green sheet 10 likewise provide alignment for the green sheet. A photocell signal generator 73 alternately senses reflected-light and no-light from the light source 70 and the mirror surface according to the non-reflecting encoding marks 72 on the disk 71. Conductors 74 convey the encoded signals from the photocell 73 to the computer thereby providing the computer with y-coordinate data for the sheet.

To provide the computer with x-coordinate data for the sheet, an illumination source 75 directs a narrow beam of light toward a mirror surfaced encoding disc 76 that is attached to the end of the rotating multi-facet mirror 62. The encoding disk has multiple non-reflecting marks 77 (only eight shown). The marks are provided in groups with the number of groups corresponding to the number of facets on the rotating multi-facet mirror 62. The number of marks in each group of marks corresponds to the number of longitudinal columns at perforation holes 42 in the web 14. The spacing between the individual marks in each group of marks includes a tangent-of-the-angle compensation whereby one of the marks is accurately aligned with a photocell signal generator 77 each time the optical scanning axis of the laser 60 sweeping through the angle 60A, 60, 60B becomes aligned with a longitudinal column of holes 42 in the web 14. The photocell 77 and the conductors 78 provide x-coordinate data to the computer in a manner similar to that in which the photocell 73 provides y-coordinate data.

As a repeating reference or "starting point" for laser piercing operations, one sprocket tooth may be omitted from the circumference of the cylinder 22 and corresponding sprocket holes omitted from the web 14, and the laminated backing sheet 16 and green sheet 10. The location of these omissions is indicated in FIG. 1 by the large dot 79 which is in alignment with a triple width encoding mark 81 that is otherwise similar to the single width encoding marks 72. The longitudinal distance along the sheet 16 between the omitted sprocket holes is preferably an integer-multiple of the length of one green sheet work piece including blank end margins that are provided between the via-hole pattern areas of sequential work sheets. Likewise, the omitted sprocket holes are preferably aligned with a centerline between two such end margins for locational reference purposes.

The motor 66 that rotates the multi-facet mirror 62 may also be arranged to rotate the cylinder 22 through a fixed-ratio gear reduction drive (not shown). The ratio of the gear reduction drive in combination with the diameter of the cylinder 22 are selected to provide a longitudinal motion to the backing sheet 16, the green sheet 10, and the web 14 such that sequential lateral scanning sweeps of the laser optical axis coincide with sequential lateral rows of perforation holes 42 in the web 14. To compensate for the longitudinal motion, the plane of the laser sweep angle 60A, 60, 60B is skewed from the axis line of the cylinder 22 by a small "leading angle" $\phi$, not shown. The angle $\phi$ may be defined as the angle whose tangent is the ratio of the longitudinal motion velocity divided by the average lateral sweep velocity of the laser optical axis across the backing sheet 16, the green sheet 10 and the web 14. A machine frame or chasis (not shown) is provided to support the previously described mechanical, optical, and electrical elements and to maintain the elements in spatial interrelationships approximately as shown in FIGS. 1 and 2. The frame includes low friction bearings for the rotating shafts 26, 34, 36, 38, 49 and 51. The bearings for the shaft 36 of the roller 30 are adjustable vertically for tensioning the web 14. The pressure chamber assembly including the end plates 52, 54 are adjustable vertically to provide close but non-binding fit between the end plates and the backing sheet 16. The illumination source 70 and the photocell 73 are mounted together on a plate that may be rotated about the axis of the shaft 26 for signal alignment purposes with the lateral rows of holes 42 in the web 14. The illumination source 75 and the photocell 77 are mounted together on a plate that may be rotated about the axis of the mirror shaft 64 for signal alignment purposes with the longitudinal rows of holes 42 in the web 14. The laser and the optical elements of the apparatus are all provided with suitable adjustments for initial alignment purposes.

The previously described photocells 73 and 77 continuously provide the computer with signal data. The computer is programmed to convert the signal data into x-y coordinates that move with the work sheets. The reference or "starting point" for the y-coordinates is the repeated omission of the sprocket hole in the moving backing sheet 16, the green sheet 10, and the web 14 designated by the dot 79. Since a corresponding sprocket tooth has been omitted from the circumference of the cylinder 22 the reference or "starting point" reoccurs once along the work sheets and the web for each revolution of the cylinder 22. The measure of the y-coordinates is the numerical count of the number of lateral rows of the perforations 42 in the web 14. Alternately, the y-coordinate count may repeat itself as an integer divisional count corresponding to the integer number of work sheets occurring between the omitted sprocket holes in the backing sheet 16 and the green sheet 10. The reference or "starting point" for the x-coordinates is the first longitudinal row of holes 42 in the web 14 adjacent to the designated dot 79 on the backing sheet 16, green sheet 10 and the web 14. The measure of the x-coordinates is the numerical count of the number of longitudinal rows of perforations 42 in the web 14 starting with the first row. The x-coordinate count restarts from zero once for each sequential sweep of the laser optical axis through the angle 60A, 60, 60B across the work sheets and the web 14. Thus, in effect, the computer is programmed to generate ongoing x and y coordinate counts for the momentary x and y coordinate intercepts of the laser optical axis with the moving backing sheet 16, the green sheet 10 and the web 14.

Each work sheet of the green sheet 10 is preassigned a part number and there may be several thousand part numbers, with each part number having a different via-hole pattern to be pierced. Part number data and the via-hole pattern piercing data for that part number are entered into the computer memory bank. The memory bank has a data capacity of several sequential work sheets. As soon as the pattern on a work sheet has its via-holes pierced its pattern data is erased from the memory bank and data for another part number is entered into the memory bank. It should be mentioned here that the part number of each work sheet may be encoded into the work sheet by a recognizable pattern of pierced holes in the leading margin of the sheet. Likewise, registration holes for alignment purposes in subsequent manufacturing processes may be pierced in the margins of the work sheets. The data in the computer memory bank is in the form of the x and y coordinate rows of each sequential hole to be pierced in a pattern for one or more part numbered work sheets. Circuits in the computer are programmed to progressively count the x-coordinate longitudinal rows corresponding to the sweep of the laser optical axis across the work sheet and the y-coordinate lateral rows as the work sheet is moved past the plane of the laser sweep angle 60A, 60, 60B. When both the x and y progressive row counts coincide with both the x and y coordinates in the memory bank for a required hole location the computer is programmed to activate a coincidence signal circuit. In a preferred mode of operation the coincidence signal is suitably processed by electronic means and applied to the laser assembly 58 by conductors 59 to "Q" switch the laser to the "on" condition thus sending a pulse of laser energy along the laser optical path and axis 60. In the continuous mode of laser operation a suitably processed coincidence signal is applied to the electrooptical deflecting device 61 by conductors 62 whereby the laser optical path and axis 65 is deflected away from the blocking means 69 permitting the laser beam 60 to focus on and/or above the backing sheet 16. With either mode of operation the laser time duration of the "on" condition or the deflection interval of the focused laser beam at the required x-y coordinate is so short that there is negligable lateral motion of the laser optical axis across the backing sheet 16.

Reference is now made to FIGS. 3–8 which show the process of forming the via-holes. When, for example, the laser optical system sharply focuses a "Q" switched or pulse modulated laser beam "on" and the laser energy at the focus point is sufficient to rapidly ionize the gas at the focus point, the result of the rapid ionization is, in effect, a miniature explosion, and within the shock wave envelop 83 of the explosion pressures in the orders of 1000 to 3000 lbs/in$^2$ can be generated. The initial size and pressure within the shock wave envelop 83 can be varied, or shaped by changing the focused diameter of the laser beam, the time duration of the laser power plus, the laser power and/or the pressure of the surrounding compressed gas.

The pressure of the ionization explosion within the waist-shaped depth of focus of the laser beam is enhanced by the presence of pressurized gas within the volume of the waist-shaped focus prior to ionization. The pressurization of the gas increases the gas density within the waist-shaped depth of focus thereby providing a greater density and number of gas atoms and/or molecules within the waist-shaped volume that may become ionized by the transfer of energy from the focused laser beam. The pressure within the intial shock wave envelope increases in a non-linear ratio within the number of ionized gas atoms and/or molecules within the waist-shaped volume. Preferably, for purposes of this invention the gas pressure, shown by arrows 68 should be in the range of 100 to 500 lbs/in$^2$ to enhance the initial explosion and confine its initial expansion to about 0.003 inches in diameter.

Figure 4:
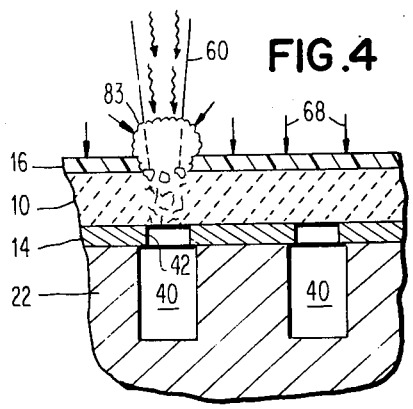
Figure 7:
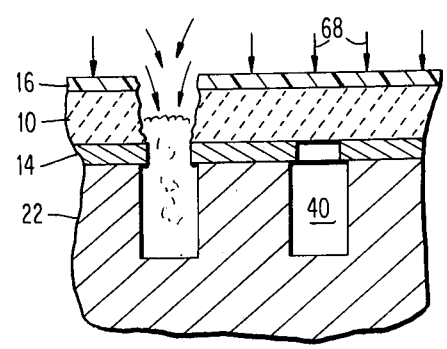
Figure 5:
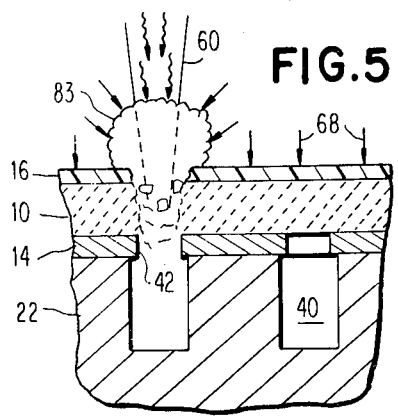

The volume within the shock wave envelope 83, FIG. 4, expands rapidly, FIG. 5, after the initial formation of the shock wave envelope, and concurrently the high pressure within the envelope is reduced rapidly by the expansion. For thicker backing sheets 16 and green sheet material 10 it may be desirable to increase the time duration of the laser energy pulse 60 as shown in FIG. 5. The increased pulse duration may be used to add laser energy to the gas within the expanding shock wave envelope 83, FIG. 5, whereby the gas pressure within the envelope is less rapidly reduced by the expansion of the envelope.

As described previously, the initial function of the localized shock wave pressure is to fracture the backing sheet 16 and the green sheet material 10. The shock wave pressure combined with the focused laser beam energy may also serve to disintegrate the molecular structure or the integrity of the backing sheet material and the binder of the green sheet material thereby decreasing their physical strength and resistance to fracturing. Additionally, the shock wave pressure may initiate an acceleration of the fractured and unsupported backing sheet and green sheet material toward and/or through an aperture of hole 42 in the web 14 as shown in FIG. 5.

Figure 6:
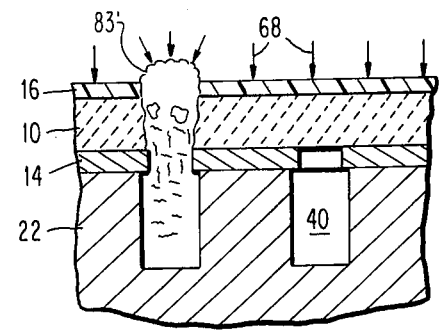

When the pressure within the shock wave envelope is reduced to the pressure of the pressurizing gas 68 by expansion and loss of heat energy, the expansion of the effective pressure within the envelope ceases and a reverse action starts to occur across a momentary equilibrium boundary 83' as shown in FIG. 6. The pressure of the pressurizing gas 68 may now exceed the localized effective pressure within the boundary 83' and is available to supplement fracturing of the backing sheet 16 and the green sheet material 10 and to further accelerate the fractured particles toward and/or through an aperture or hole 42 in the web 14. The supplementary effects of the pressurized gas 68 are significant because of the extremely short time duration of the high pressure shock wave induced by the laser ionization. In a physical sense, the gas pressurization 68 may perform a major portion of the physical work effort required to perforate via-holes.

Figure 8:
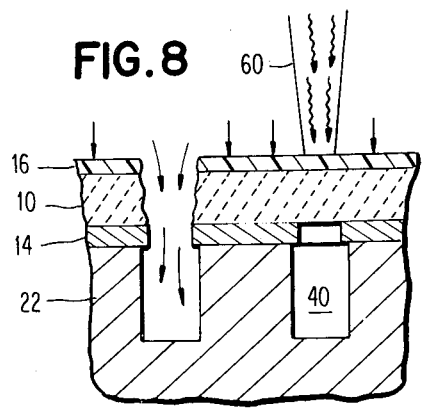

The interposition of the web 14 functions to support the backing sheet 16 and the green sheet 10 from deformation and fracturing by the gas pressure 68 and the shock wave pressure as the backing sheet 16 and green sheet 10 pass over the circumferential grooves 40 in the rotating cylinder 22. The interposed support of the web 14 provides such support except for the areas of the apertures or holes 42 in the web 14 which serve to define the unsupported areas and thus define the fracture zones which then become defined via-holes when so formed by the laser induced shock wave and the gas pressure 68. In combination, the aperture formed by the fracturing and/or disintegration of the backing sheet 16 on the top surface of the green sheet 10 and the aperture or hole 42 in the web 14 on the bottom of the green sheet define a straight fracture zone between the top and bottom apertures and an acceptable via-hole 12 of the required diameter through the green sheet. The continuous action of the pressurized gas, coupled with the vacuum applied to groove 40 blows the fractured material through the aperture or hole 42, in the web 14 (FIG. 6) and is exhausted in a conventional manner. The flushing action of the compressed gas continues as the focus of the laser beam sweeps to the next piercing coordinates as shown in FIG. 8.

As shown and described, the compressed gas performs four basic functions; it increases the overall high pressure of the explosion, confines the explosion, contributes to the fracturing, and provides the carrier for the ejection of fractured material resulting from the explosion. Without it, the shock wave region would be larger resulting in a bigger, less defined via-hole.

The definition of the via-hole is also facilitated by the backing material 16. Due to the localized brittle nature of the green sheet, a shock wave applied directly to it would fracture the material cuasing a hole to be formed, but also fracturing material in an area adjacent to the hole. The reslut would be a washing effect, similar to an attempt to dig a hole in dry sand, where the walls tend to collapse forming a funnel rather than maintaining a true corner. If the backing, or top material is much harder (less friable) it will restrict the washing effect and give better definition as the shock wave moves through the green sheet. Alternatively, a material which will convert directly to the vapor phase due to the heat caused by the laser can be employed as the backing sheet 16. Hence, using this material, at the same time the beam ionizes the gas just above the layer it also vaporizes the localized area of the backing sheet 16. Further pressure may be created by laser dissociation and ionization of the vaporized material.

This technique utilizes the compressed gas to perform most of the physical work of further fracturing and removing material from the via-hole. The laser is needed only to create a highly localized fracture zone in the green sheet and the power required for this method is only 1/10 to 1/100 of the laser power normally utilized in previous methods where high power burning or other penetration techniques were employed.

Figure 9:
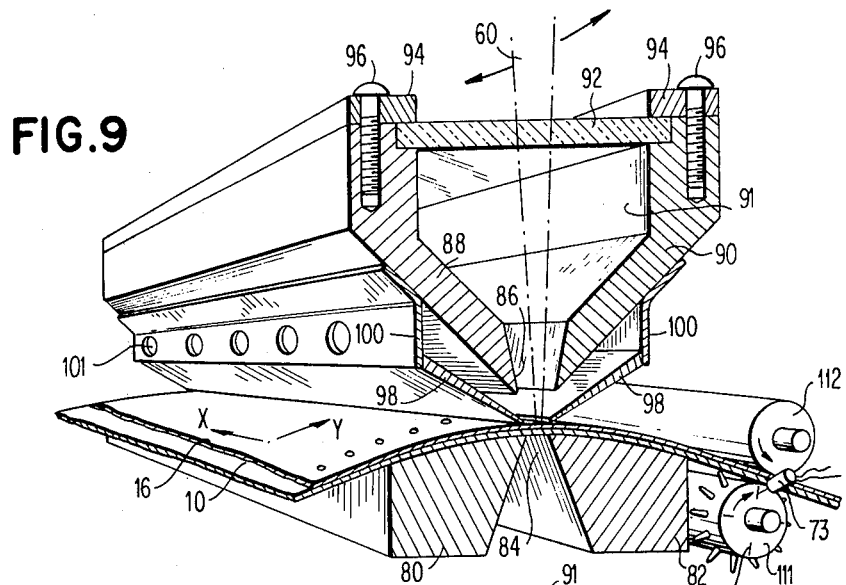
FIG. 9 is a functional operational diagram of the apparatus of a second preferred embodiment of the invention.

A second embodiment of the invention is shown schematically in FIG. 9. Elements of the apparatus described and shown relative to FIGS. 1 and 2 of the preferred embodiment may also be used with the second embodiment as shown in FIGS. 9 to 13. When such elements perform essentially similar functions in both the preferred and the second embodiments the elements may be so designated by the previously used numbers of the preferred embodiment and descriptions thereof may be brief or omitted.

The green sheet 10 and the backing sheet 16 are positioned for movement in the y-direction and rest in the work area on members 80, 82. The top surfaces of 80 and 82 are preferably coated with teflon and define a channel or slot 84 approximately 0.006 inch wide and 5½ inches long aligned below a linear nozzle 86. This nozzle, approximately 0.009 inch wide and 6 inches long is formed by walls 88 and 90 of a pressure chamber 91. The top part of the chamber is formed by window 92 which is held onto the side walls by backing plates 94 and screws 96. End walls, not shown, complete the chamber. A pair of V-shaped members 98 are interposed between the nozzle and the green sheet at distances above the green sheet 10 of about 0.002 inch and with a spacing therebetween of about 0.007 inch. Flanges 100 operably couple the members 98 to the nozzle assembly 88 in a rigid fashion. Apertures 101 in the flanges 100 permit the escape of low pressure gas from the zone below the nozzle 88, 90.

In a manner similar to the FIG. 1 embodiment, the pressure chamber 91 is charged with a non-oxidizing gas and the laser beam is focused and scans in the x-direction while the backing sheet 16 and the green sheet 10 move in the y-direction. Rather than utilize the drums and rollers of FIG. 1, the green sheet simply slides through the work area by being drawn between a sprocket toothed roller 111 and a contacting compliant roller 112. The rollers 111, 112 are driven by the mirror rotating motor 66 through a fixed-ratio near reduction drive (not shown) whereby the x-coordinate sweep of the optical axis 60 of the focused laser beam together with the y-coordinate form a raster scan pattern. Encoding marks 72 (not shown) and a photocell 73 (not shown) at the end of the roller 111 generate y-coordinate signal data for the computer as described in the preferred embodiment. The computer thus has x-y coordinate data for the momentary intercept of the laser optical axis on the moving backing sheet 16 and the green sheet 10. The x-y coordinate data in the computer memory bank for the required via-hole locations function with a coincidence circuit to switch the laser "on" when the x-coordinates of the sweeping optical axis of the laser and y-coordinates of the moving backing sheet 16 and green sheet 10 coincide with the x-y coordinates of the required via-holes.

Figure 10:
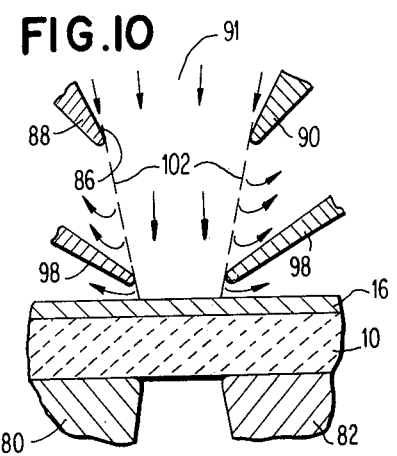
FIGS. 10–13 illustrate schematically the cutting action of the shock wave in accordance with the operation of the FIG. 9 embodiment of the invention.
Figure 11:
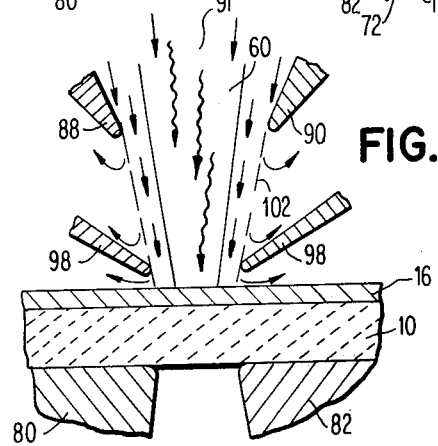

In the FIG. 9 embodiment, the induced shock wave boundaries 102 define a linear jet of compressed gas which is accelerated toward the green sheet by the nozzle 86 (FIG. 10). The convergent shock wave boundaries 102 (FIG. 10) of the linear jet extend on both sides of the jet from the linear nozzle 86 down to the moving backing sheet 16. The gas pressure within the convergent shock wave boundaries of the jet is essentially equal to the gas pressure within the chamber 91. Thus, with the convergent boundaries extending down to the backing sheet the chamber gas pressure may be applied to a narrow area that extends transversely across the backing sheet. The transverse sweep of the laser optical axis is aligned with the transverse pressurized area of the backing sheet. When the laser is switched "on" the waist-shape depth of focus of the laser is totally within the convergent shock wave boundaries 102 of the pressurized gas within the jet. The laser induced ionization and explosion (FIG. 12) occurs within the pressurized gas at and/or above the surface of the backing sheet 16 to create a localized fracture zone in the backing sheet and the green sheet 10 as in the preferred configuration shown in FIGS. 1 to 6. After the fracturing has occurred the pressurized gas (FIG. 13) drives the fractured material of the backing sheet and the green sheet down through the localized fracture zone to form the via-hole.

Figure 12:
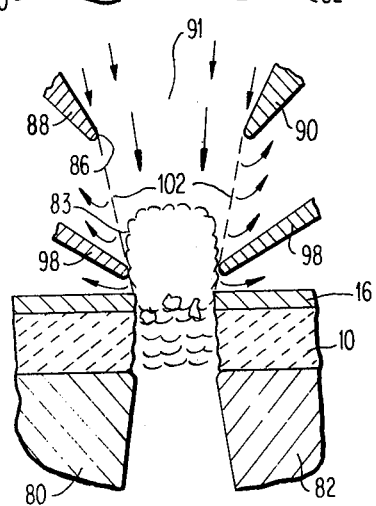
Figure 13:
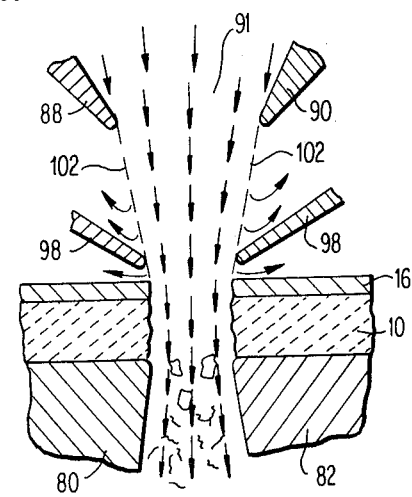

As previously described, within the convergent shock wave boundaries 102, the gas pressure of the jet is essentially the same as the gas pressure in the chamber 91 above the jet nozzle 86. A portion of the gas continuously flows outward from the jet across the shock wave boundaries at the velocity of sound to a zone of atmospheric pressure outside the shock wave boundaries. While flowing outward the gas, now at atmospheric pressure, retains the high downward velocity imparted to it by the jet. If the downward velocity were to be intercepted by a solid object part of the kinetic energy of the gas velocity would be converted to static gas pressure at the surface of the intercepting object. The members 98 are interposed between such downward gas velocity and the backing sheet 16 and prevent the static gas pressure from being exerted on the backing sheet. This reduces the force required to slide the green sheet 10 over the teflon members 80, 82. While the green sheet is relatively weak, it has sufficient strength to slide under the pressure exerted by the narrow jet within the convergent shock wave boundaries but it may rupture while sliding under the otherwise extended static pressure areas without the interposed members 98. The members 98 also act to shape or focus the shock wave onto the green sheet. As shown in FIGS. 12 and 13 the operation is the same as previously described with the debris exiting through the slot 84. The computer then determines the next location for a via-hole and when the scan reaches that point the laser will again be switched "on" or deflected from the blocking means 69 (see FIG. 2).

In still other configurations of the invention the function of the backing sheet 16 may be replaced in the preferred and second configurations by increasing the percentage of liquid "binder" used in mixing and casting the green sheet material. In one of the casting processes the binder is mixed with powdered alumna and a small percentage of powdered glass frit to form a casting slurry. The slurry is poured onto a flat Mylar* sheet and passed under a doctor blade to form a casting of uniform thickness. The slurry on the Mylar* sheet is then set aside for an overnight period. During this period the solid material settles down on the Mylar* sheet while a small amount of the binder tends to float above the solid particles. The slurry cast material is next cured under infrared lamps to polymerize the binder and form a sheet of stable green sheet material that may be stripped from the Mylar* sheet. By increasing the percentage of binder in the slurry mixture a thicker layer of binder may be made to float above the solid particles. After infrared curing the thicker layer of polymerized binder may be used in this invention to perform the equivalent functions of the backing sheet 10.

(*Trademark of E. I.Du Pont

It is thought that the invention and many of its attending advantages are understood from the foregoing description and it will be apparent that changes may be made in the steps of the method and the apparatus described without departing from the spirit and scope of the invention.

What is claimed is:

1. Apparatus for perforating a material comprising:
   a. means for positioning said material in accurate registration in a work area;
   b. a gas under pressure to be supplied to said work area;
   c. means for confining said pressurized gas within the work area comprising a chamber with the material to be perforated forming a wall of said chamber;
   d. a laser source and means for directing said laser beam onto said work area; said beam being periodically operative to ionize said gas above the area of said material, and generating a shock wave, said compressed gas confining the shock wave and directing it towards the material; and
   e. means for removing the debris from the work area wherein the means for confining said pressurized gas comprises:
      a plurality of rollers resting on said material and adapted for rotation as the material passes through the work area thereby keeping said chamber in a stationary position; and
      a window to transmit said beam.

2. Apparatus for perforating a material comprising:
   a. means for positioning said material in accurate registration in a work area;
   b. a gas under pressure to be supplied to said work area;
   c. means for confining said pressurized gas within the work area comprising a chamber with the material to be perforated forming a wall of said chamber;
   d. a laser source and means for directing said laser beam onto said work area; said beam being periodically operative to ionize said gas above the area of said material, and generating a shock wave, said compressed gas confining the shock wave and directing it towards the material; and
   e. means for removing the debris from the work area wherein the means for confining said pressurized gas comprises:
      a linear nozzle extending the width of said material;
      a window joining the walls of said linear nozzle to form a top plate of said chamber; and
      channel means operatively disposed between said nozzle and said material.

3. The apparatus of claim 2 wherein said pressurized gas is accelerated through said nozzle toward the material and turbulent gas is separated from the accelerated gas by said channel means.

4. Apparatus for perforating a material comprising:
   a. means for positioning said material in accurate registration in a work area;
   b. a gas under pressure to be supplied to said work area;
   c. means for confining said pressurized gas within the work area comprising a chamber with the material to be perforated forming a wall of said chamber;
   d. a laser source and means for directing said laser beam onto said work area; said beam being periodically operative to ionize said gas above the area of said material, and generating a shock wave, said compressed gas confining the shock wave and directing it towards the material; and
   e. means for removing the debris from the work area wherein said means for directing the laser includes: a rotating mirror, said laser beam being reflected off said mirror to scan the work area.

5. Apparatus for perforating a material comprising:
   a. means for positioning said material in accurate registration in a work area;
   b. a gas under pressure to be supplied to said work area;
   c. means for confining said pressurized gas within the work area comprising a chamber with the material to be perforated forming a wall of said chamber;
   d. a laser source and means for directing said laser beam onto said work area; said beam being periodically operative to ionize said gas above the area of said material, and generating a shock wave, said compressed gas confining the shock wave and directing it towards the material; and
   e. means for removing the debris from the work area wherein the means for removing debris from the work area comprises a vacuum system operatively connected to said work areas and wherein the compressed gas is driven through said formed perforation into an exit channel positioned under said material, said vacuum system being connected to said channel.

6. Apparatus for perforating a material comprising:
   a. means for positioning said material in accurate registration in a work area;
   b. a gas under pressure to be supplied to said work area;
   c. means for confining said pressurized gas within the work area comprising a chamber with the material to be perforated forming a wall of said chamber;
   d. a laser source and means for directing said laser beam onto said work area; said beam being periodically operative to ionize said gas above the area of said material, and generating a shock wave, said compressed gas confining the shock wave and directing it towards the material; and
   e. means for removing the debris from the work area wherein, the means for directing the laser beam onto said work area includes, a rotating mirror in optical alignment with said beam to reflect it at a predetermined angle and focusing means in optical alignment with the reflected beam to direct it to a predetermined point on said material.

7. The apparatus according to claim 6 including first means for determining the position of the laser beam and second means for sensing the movement of material through the work area.

8. The apparatus of claim 7 wherein said first means is an encoder comprising a series of indicia on said rotating mirror, means for illuminating said indicia and detector means for sensing the movement of the indicia on said rotating mirror.

9. The apparatus of claim 7 wherein said second means is an encoder comprising a series of indicia positioned on said means for positioning said material, means for illuminating said indicia and detector means for sensing the movement of the indicia on said means for positioning said material.

* * * * *